United States Patent
Yamaguchi et al.

(10) Patent No.: US 6,573,014 B2
(45) Date of Patent: Jun. 3, 2003

(54) CHARGED-PARTICLE-BEAM MICROLITHOGRAPHY METHODS FOR EXPOSING A SEGMENTED RETICLE

(75) Inventors: Takeshi Yamaguchi, Kanagawa (JP); Shinichi Kojima, Wappingers Falls, NY (US)

(73) Assignee: Nikon Corporation, Tokyo (JP)

( * ) Notice: Subject to any disclaimer, the term of this patent is extended or adjusted under 35 U.S.C. 154(b) by 4 days.

(21) Appl. No.: 09/749,962

(22) Filed: Dec. 27, 2000

(65) Prior Publication Data

US 2001/0019812 A1 Sep. 6, 2001

(30) Foreign Application Priority Data

Dec. 27, 1999 (JP) .......................... 11-369984

(51) Int. Cl.$^7$ ................................. G03C 5/00
(52) U.S. Cl. ...................... 430/30; 430/296; 430/942
(58) Field of Search ........................ 430/30, 296, 942

(56) References Cited

U.S. PATENT DOCUMENTS 6,087,052 A * 7/2000 Manabe et al. ............ 430/296
6,117,600 A * 9/2000 Nakasuji .................... 430/296
6,218,058 B1 * 4/2001 Yahiro et al. ............... 430/296

* cited by examiner

Primary Examiner—Christopher G. Young
(74) Attorney, Agent, or Firm—Klarquist Sparkman LLP

(57) ABSTRACT

Charged-particle-beam (CPB) microlithography apparatus and methods are disclosed that employ a segmented reticle in which the pattern defined by the reticle is divided into multiple subfields, and each subfield is subdivided into multiple subregions each constituting a respective "group" of subregions. During exposure of the pattern from the reticle to a sensitive substrate using a charged particle beam, a charged-particle illumination beam is directed in sequence to each of the groups. At each group, the illumination beam is directed to expose the respective subregions in the group in a predetermined order before directing the illumination beam to a subsequent group. Direction of the illumination from one group to the next can be performed using a first deflector, and direction of the illumination beam from one subregion to the next in a group can be performed using a second deflector.

7 Claims, 7 Drawing Sheets

CHARGED-PARTICLE-BEAM MICROLITHOGRAPHY METHODS FOR EXPOSING A SEGMENTED RETICLE

FIELD OF THE INVENTION

This invention pertains to microlithography (projection transfer of a pattern, defined on a reticle or mask, onto a sensitive substrate using an energy beam). Microlithography is a key technique used, for example, in the fabrication of microelectronic devices such as integrated circuits and displays. More specifically, the invention pertains to microlithography performed using a charged particle beam (e.g., electron beam or ion beam) as the energy beam. Even more specifically, the invention pertains to charged-particle-beam (CPB) microlithography performed using a divided (segmented) reticle.

BACKGROUND OF THE INVENTION

Exposure schemes exploited by conventional charged-particle-beam (CPB) microlithographic exposure apparatus can be divided broadly into the following three types: (1) spot-beam exposure systems, (2) variably shaped beam exposure systems, and (3) block (cell) exposure systems. Each of these exposure schemes provides prospects of superior resolution of pattern elements compared to optical microlithography, but exhibit greatly reduced throughput compared to optical micro lithography.

The exposure schemes (1) and (2) perform exposure by tracing a pattern using a charged particle beam having a very small spot diameter (round transverse profile) or a very small rectangular transverse profile. Consequently, throughput obtained with these schemes is very low.

Block exposure was developed to improve throughput over that obtainable using schemes (1) and (2). Block exposure is especially useful for patterns in which a pattern unit (cell) is repeated many times, such as in a pattern containing a large number of identical memory cells. The pattern unit (typically measuring, e.g., 5 $\mu$m×5 $\mu$m on the reticle) covers a larger portion of the overall pattern than is exposed at any one instant by schemes (1) or (2). The pattern unit is transferred onto respective locations on the wafer by individual respective "shots." I.e., at each respective location on the wafer, the pattern unit is batch-exposed, thereby improving throughput. Unfortunately, this scheme is practical only for a few types of patterns (as noted above, the patterns typically are characterized by having a basic pattern unit or "cell" that is repeated many times in the pattern). However, essentially all such patterns also include non-repeated portions that cannot be formed on the wafer by projecting the cell. Rather, the non-repeated portions typically are exposed using the variable-shaped beam exposure scheme, so throughput is not increased as much as desired.

To improve throughput of CPB microlithography apparatus and methods, considerable research has focused on exposure schemes employing a "divided" or "segmented" reticle. In a divided-reticle scheme, the entire reticle pattern is divided into multiple subfields (each defining a respective portion of the overall pattern) that are exposed individually onto a suitable "sensitive" substrate in an ordered manner (e.g., sequentially). On the reticle, each subfield can have dimensions of, for example, 1 mm×1 mm, which is many times larger than a pattern unit used in the block exposure scheme. Hence, throughput using the divided reticle scheme is correspondingly greater.

Divided-reticle CPB microlithography is described further in connection with FIGS. 6, 7(a)–7(b), and 8. Turning first to FIG. 6, a profile of a typical substrate is shown (in this instance a semiconductor "wafer"). The substrate is rendered "sensitive" by application of a coating of a "resist" that is reactive to exposure by a charged particle beam. Thus, the substrate can be imprinted with a latent image of a pattern defined on the reticle. As shown in the figure, the substrate includes a plurality of "chips" or "dies." Each chip is divided into a plurality of stripes (without intending to be limiting in any way, the figure shows, by way of example, four stripes a–d). Each stripe is divided into multiple subfields.

After completing exposure of a die, each subfield on the reticle has a counterpart subfield image in the die as formed on the substrate. The subfield images on the substrate typically are smaller than corresponding subfields on the reticle, usually by a factor termed a "demagnification ratio," such as 1/4 or 1/5, that is determined by the projection lens used to project the pattern from the reticle to the substrate. For example, if the demagnification ratio is 1/4, then a reticle subfield is four times larger than the corresponding image of the subfield on the substrate.

A portion of a divided reticle is shown in FIGS. 7(a)–7(b), depicting only one representative reticle subfield 100. FIG. 7(a) provides a plan view of the subfield 100 (with surrounding area), and FIG. 7(b) is an elevational section along the line A—A. For convenience in explanation, the size relationship of the subfield image on the substrate to the corresponding subfield on the reticle is not depicted accurately in the figure. The pattern element defined in the subfield 100 is denoted by the number 101. The pattern-defining portion 101 typically has a square profile with each side measuring 1 mm, for example. The pattern-defining portion 101 in this example defines a U-shaped pattern element 105. In this example, the pattern element 105 is defined by a corresponding aperture in a reticle membrane 104, thereby indicating that the depicted reticle is a "stencil" reticle. Surrounding the subfield 101 is an unpatterned skirt 102 bounded by a strut region 103. The strut region 103 has a width of 200 $\mu$m, for example. Extending away from each strut region 103 is a respective strut 106. The strut 106 serves mainly to strengthen and provide rigidity to the reticle. The skirt 102, having an exemplary width of about 100 $\mu$m, allows a certain positional tolerance for the beam illuminating the subfield 101. I.e., even if the beam experiences a limited amount of lateral positional displacement, the skirt 102 allows the beam nevertheless to illuminate the entire subfield 101 without impinging on a strut region 103. As shown in FIG. 7(b), the strut 106 is relatively thick in the Z-dimension. If the beam illuminating the reticle should impinge on a strut region 103 or strut 106, then significant heating of the reticle would result, which probably would cause undesirable reticle distortion.

It is not necessary that all subfields of a pattern be defined on a single reticle. The subfields alternatively can be distributed among multiple reticles.

Divided-reticle projection-exposure using a charged particle beam generally is performed in a manner as shown in FIG. 8, which depicts an exemplary exposure, within a stripe, of a row of subfields. During exposure, the reticle (mounted on a reticle stage) and substrate (mounted on a substrate stage) move synchronously in opposite directions relative to each other. The stage motions can be continuous "scanning" motions at fixed respective velocities that are determined mainly by the demagnification ratio of the projection lens used to project respective images of the subfields onto the substrate. During exposure of individual subfields, unpatterned regions (i.e., skirts 102 and strut regions 103) are not exposed. Hence, the ratio of substrate-stage velocity to reticle-stage velocity is not exactly equal to the demagnification ratio. I.e., to exclude imaging of skirts and strut regions, the velocity of the substrate stage relative to the reticle stage is slightly slower than would be dictated by the demagnification ratio. As the "illumination beam" illuminates a subfield on the reticle, an image of the illuminated subfield is projected, via a "patterned beam" passing through a projection-optical system, onto a corresponding region on the substrate, thereby "exposing" the substrate with the image. During exposure of successive rows of subfields, the reticle stage and substrate stage move in opposite directions in one dimension (e.g., X-dimension). Meanwhile, the illumination beam and patterned beam are deflected in opposite directions in a second dimension (e.g., Y-dimension) to expose successive subfields in each row. Such deflections of the illumination beam and patterned beam are imparted by respective deflectors.

Thus, each stripe of the pattern is exposed row-by-row in a raster manner, and the pattern is exposed stripe-by-stripe to complete exposure of a single chip on the substrate.

Because a divided-reticle CPB microlithography apparatus performs exposure using the scheme summarized above (wherein each subfield is "batch"-exposed and the subfields are exposed sequentially in a step-and-repeat or continuous scanning manner), throughput can be improved greatly over that obtainable using the three prior schemes listed above. However, increasing subfield size to improve throughput causes substantial problems such as $\Delta$blur (dispersion of blur) and increased distortion within subfield images. If $\Delta$blur within a subfield is sub-optimal, then the uniformity of pattern line widths within the subfield is degraded. If distortion within a subfield becomes excessive, then the connecting (stitching) accuracy of adjoining subfield images on the substrate, and the overlay accuracy of successive layers of the chip, become poor. This makes it difficult or impossible to fabricate acceptable microelectronic devices. As the density of microelectronic devices continues to increase, these problems tend to become increasingly difficult to accommodate and solve.

SUMMARY OF THE INVENTION

In view of the shortcomings of the prior art as summarized above, an object of the invention is to provide charged-particle-beam (CPB) microlithography methods and apparatus that achieve improved $\Delta$blur and reduced distortion within individual subfields or other exposure units as projected from a segmented reticle onto the substrate. Another object is to achieve these objectives while maintaining acceptably high throughput.

According to a first aspect of the invention, methods are provided for performing CPB microlithography in which a region on a pattern-defining reticle, divided into multiple subfields, is illuminated with an illumination beam to produce an image of the illuminated region as projected on a sensitive substrate. A representative embodiment of such a method is directed specifically to methods for exposing the subfields. The subfields are subdivided into respective groups each containing multiple (at least two) subregions. An illumination beam is directed in sequence to each of the groups. At each group, the illumination beam is directed to expose the respective subregions in the group in a predetermined order before directing the illumination beam to a subsequent group. The subregions in each group can be exposed in the predetermined order that is identical from one group to the next in the sequence. Alternatively, the subregions in each group can be exposed in the predetermined order that is identical for every other group in the sequence.

The step of directing the illumination beam in sequence to each of the groups desirably is performed using a first deflector. The step of directing the illumination beam to expose the respective subregions in the group in a predetermined order before directing the illumination beam to a subsequent group desirably is performed using a second deflector. The first and second deflectors desirably are provided in an illumination-optical system of the apparatus.

According to another aspect of the invention, CPB microlithographic exposure apparatus are provided that expose a pattern, defined by a segmented reticle divided into multiple subfields each defining a respective portion of the pattern, onto a sensitive substrate using a charged particle beam so as to form respective transfer images of the subfields on the sensitive substrate. In a representative embodiment of such an apparatus, an illumination-optical system is situated and configured to direct a charged-particle illumination beam from a source to the segmented reticle, in which reticle each subfield comprises a respective group of multiple subregions. A first deflector is situated and configured to deflect the illumination beam from one group to the next on the reticle in a predetermined exposure sequence. A second deflector is situated and configured to deflect the illumination beam, within a group selected by the first deflector, to expose the respective subregions in the selected group in a predetermined order before the illumination beam is deflected to a subsequent group. A projection-optical system is situated and configured to form a respective image, on a sensitive substrate, of each subregion illuminated by the illumination beam. The apparatus desirably includes a controller connected to the first and second deflectors, wherein the deflector is configured to energize the first deflector in the predetermined exposure sequence and to energize the second deflector in the predetermined order.

The apparatus can include a third deflector situated between the reticle and the substrate. The third deflector is configured to direct, in synchrony with the second deflector, formation of the respective image on a corresponding predetermined location on the sensitive substrate.

The foregoing and additional features and advantages of the invention will be more readily apparent from the following detailed description, which proceeds with reference to the accompanying drawings.

DETAILED DESCRIPTION

This invention is described below in the context of representative embodiments that are not intended to be limiting in any way. Furthermore, the described embodiments are set forth in the context of using an electron beam as an exemplary microlithographic energy beam. It will be understood, however, that the general principles described below can be applied with equal facility to use of any of various other charged particle beams, such as an ion beam.

Figure 1:
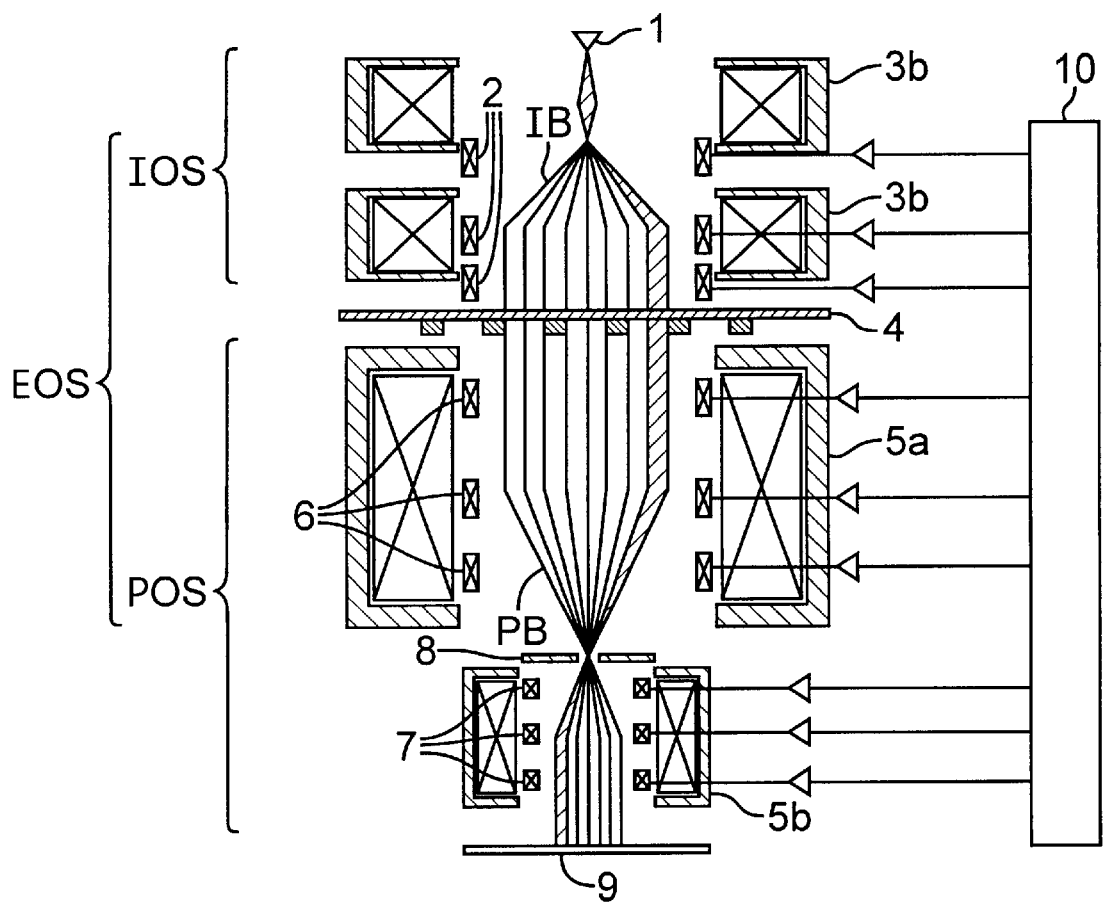
FIG. 1 is a schematic elevational diagram of a charged-particle-beam (CPB) microlithography apparatus according to a representative embodiment of the invention.

A representative embodiment of an electron-beam microlithography apparatus according to the invention is depicted in FIG. 1. An "illumination beam" is produced by an electron gun 1 situated at the extreme upstream end of the "electron-optical system" EOS shown in FIG. 1. Propagating downstream of the electron gun 1, the illumination beam IB passes in a generally axial direction through various components of an "illumination-optical system" IOS (i.e., that portion of the electron-optical system located between the electron gun 1 and the reticle 4). The components of the illumination-optical system IOS include deflectors 2 and illumination lenses 3a, 3b. As the illumination beam IB passes through the illuminated region on the reticle 4, the beam acquires an ability to form, downstream of the reticle, an image of the illuminated region of the reticle. Hence, the beam downstream of the reticle is termed an "imaging beam" or "patterned beam" PB. The patterned beam PB propagates from the reticle 4 to the substrate 9 through various components of a "projection-optical system" POS, which includes projection lenses 5a, 5b; deflectors 6, 7; and a contrast aperture 8. Each of the lenses and deflectors constituting the electron-optical system EOS (i.e., the illumination-optical system IOS and the projection-optical system POS) is connected via a respective amplifier to a controller 10. (In the figure, only the connections to the deflectors are shown.)

As with a conventional CPB microlithography apparatus, the FIG. 1 embodiment includes a reticle stage and a wafer stage (not specifically detailed in FIG. 1) for holding the reticle 4 and substrate ("wafer") 9 during exposure. During actual exposure, the respective stages move the reticle 4 and substrate 9 in mutually opposite directions along one dimension, at respective constant scanning velocities, to progress along a stripe. The respective stage velocities are related to one another by the demagnification ratio of the projection lenses 5a, 5b. In FIG. 1 the scanning direction is perpendicular to the plane of the page. As the stripe is scanned in this manner, the subfields are exposed row-by-row and subfield-by-subfield in each row.

The illumination beam IB emitted from the electron gun 1 is shaped by passage through a beam-shaping aperture (not shown) in the illumination-optical system IOS. An image of the beam-shaping aperture is formed, by the illumination lenses 3a, 3b, on the reticle subfield that is being illuminated at a particular instant. An image of the illuminated reticle subfield is formed on the substrate 9 by the projection lenses 5a, 5b. As the patterned beam PB passes through the projection lenses 5a, 5b, the deflectors 6, 7 reduce aberrations caused by the projection lenses 5a, 5b. The deflectors 6, 7 also deflect the patterned beam PB as required to remove any gaps between subfield images, as formed on the substrate 9, corresponding to struts and skirts. Thus, the individual subfield images as formed on the substrate 9 are "stitched" together in a contiguous manner to form a complete pattern image on the substrate.

The contrast aperture 8 provides contrast in the pattern image as formed on the substrate 9 by absorbing portions of the patterned beam PB containing electrons scattered by passage through the reticle 4. (As an alternative to a stencil reticle, the reticle 4 can be configured such that pattern elements are defined by localized regions of the reticle that differ from each other in the degree to which the regions scatter electrons of the illumination beam incident on the reticle. The latter type of reticle is termed a "scattering-membrane" reticle.)

In general, each subfield is divided into multiple (at least two) subregions. The subregions of each subfield are regarded as separate "groups" of subregions. The subregions of a particular group are exposed in a defined order before proceeding to the next group. In exposing the subregions of a group and in proceeding from one group to the next, deflectors are used to deflect the illumination beam and patterned beam as required. The deflections are made extremely rapidly.

Figure 2A:
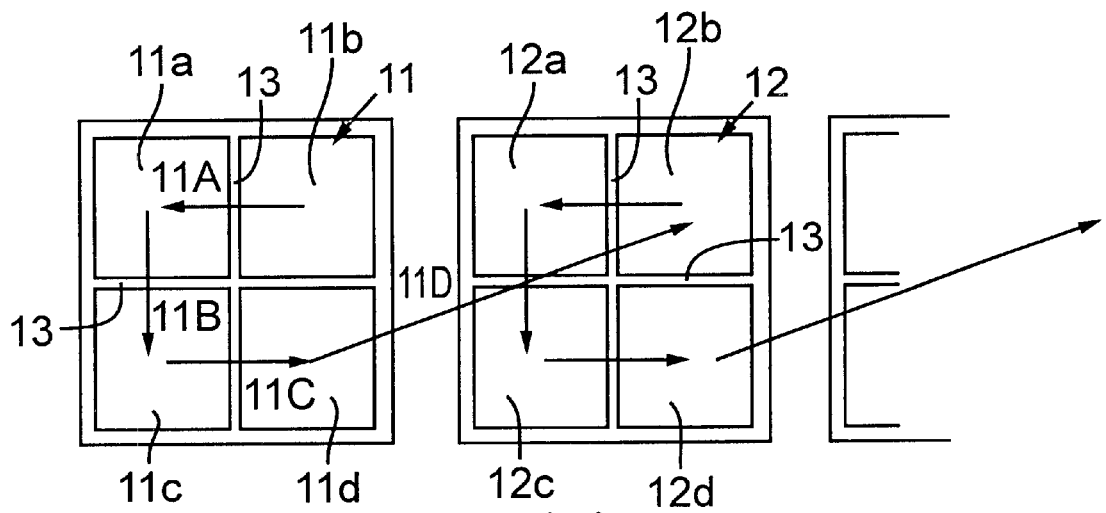
FIGS. 2(*a*)–2(*c*) are planar views of respective exposure sequences for subregions within adjacent subfields, according to respective representative embodiments.
Figure 2B:
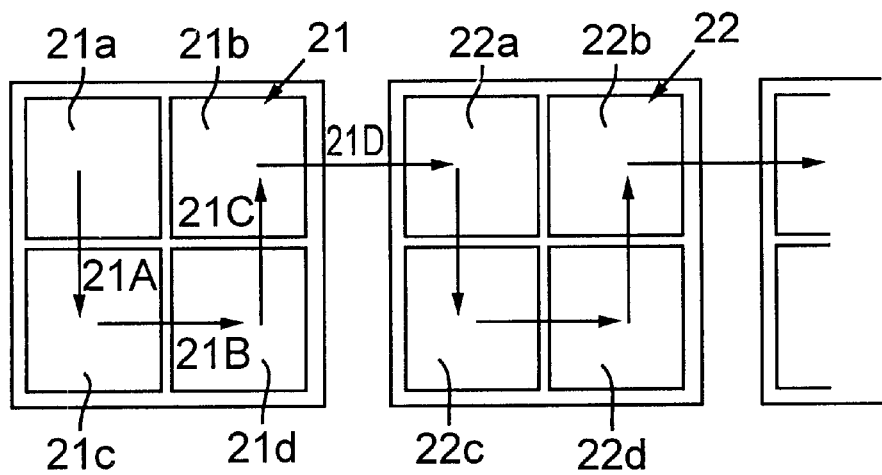
Figure 2C:
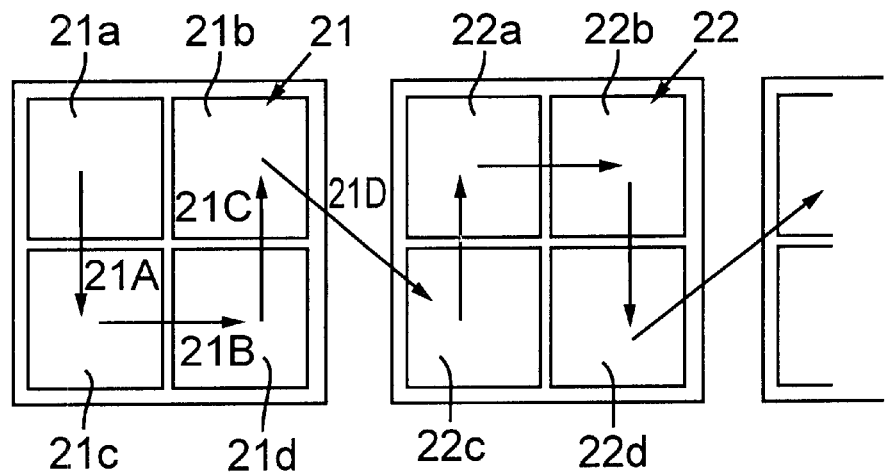
Figure 6:
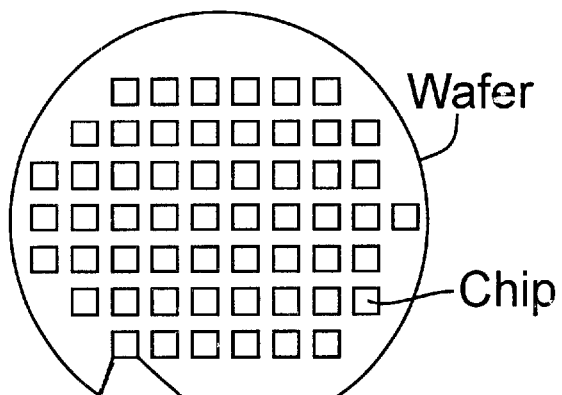
FIG. 6 depicts a conventional scheme for exposing a chip pattern using a reticle divided into multiple stripes, wherein each stripe is divided into multiple subfields.
Figure 8:
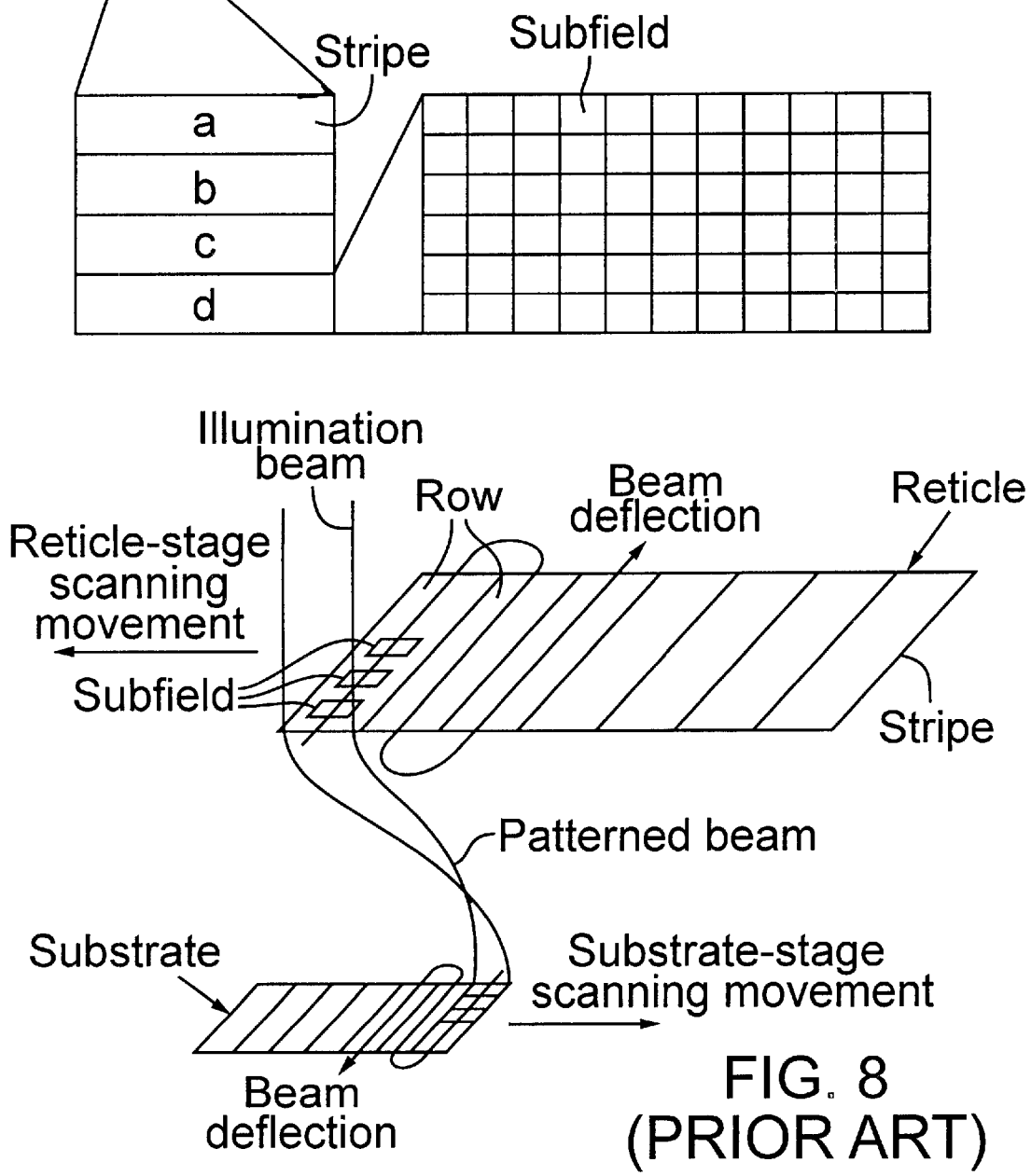
FIG. 8 depicts a conventional divided-reticle scheme for exposing a stripe from a divided reticle onto a substrate by CPB microlithography.
Figure 7A:
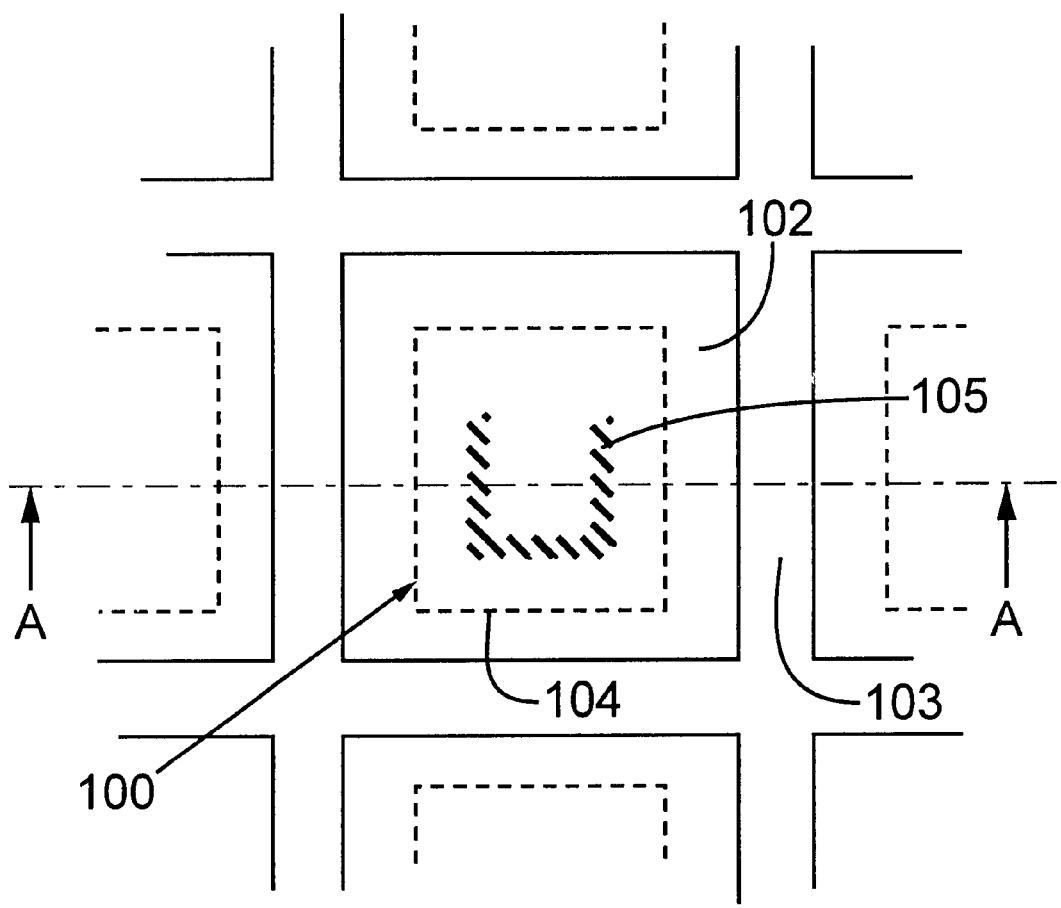
FIG. 7(a) is a plan view of a subfield and environs of a conventional divided reticle for use in CPB microlithography.
Figure 7B:
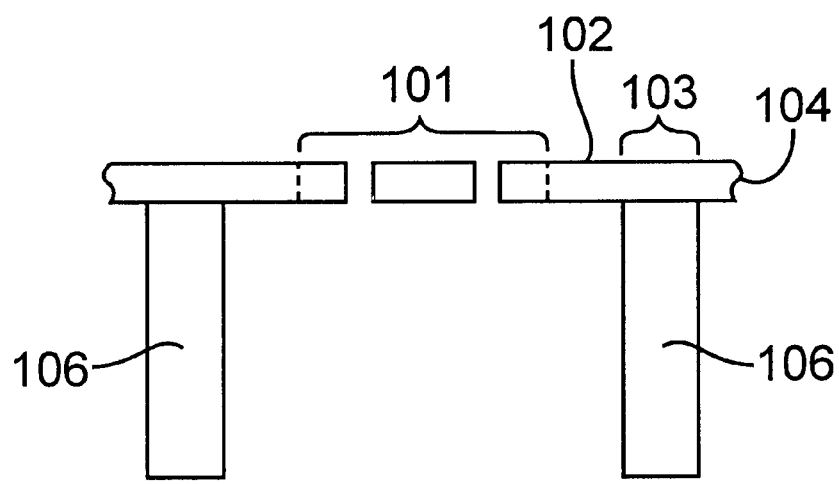
FIG. 7(b) is an elevational section along the line A—A in FIG. 7(a).

By way of example, each subfield of the reticle 4 (e.g., a subfield such as any of those shown in FIG. 6) is divided into four subregions, and each resulting array of subregions is termed a respective "group." For example, in FIG. 2(a), the left-hand subfield is divided into the four subregions 11a–11d, and the right-hand subfield is divided into the four subregions 12a–12d. The subregions in each subfield form respective groups 11, 12 of subregions. In each group 11, 12, the constituent subregions are separated from each other by a skirt 13 that is, e.g., 100 μm wide. Exemplary respective orders (sequences) in which the subregions can be exposed are shown in FIGS. 2(a)–2(c). The subregions in a particular group are illuminated in a particular sequence before advancing to the next group. As each subregion in a group is illuminated with the illumination beam, adjacent subregions of the group or of an adjacent group are not illuminated. For example, in FIG. 2(a) exposure begins at the subregion 11b in the left-hand group 11, and exposure of subsequent subregions 11a, 11c, 11d in the group 11 proceeds according to the arrows 11A, 11B, 11C, respectively. Shifting exposure to the right-hand group 12 proceeds according to the arrow 11D, and the subregions in the right-hand group 12 are exposed in the same manner and in the same order as in the left-hand group 11. I.e., in FIG. 2(a), the subregions in the group 11 are exposed in the order 11b, 11a, 11c, 11d, which is the same as the order in which the subregions in the group 12 are exposed.

Shifting the illumination beam according to the arrows 11A, 11B, 11C, 11D is performed using the three deflectors 2 shown in FIG. 1. Of the three deflectors 2 in FIG. 1, the upper two are used for shifting the illumination beam between adjacent groups 11 and 12, and the lowest is used for shifting the illumination beam from one subregion to the next in a single group. The upper two deflectors 2 are configured to produce a relatively large lateral deflection of the beam, and the lowest deflector 2 is configured to produce a relatively small lateral deflection within an extremely short time interval.

It will be understood that the order with which subregions in a group are exposed is not limited to that shown in FIG.

2(a). Exemplary alternative orders are shown in FIGS. 2(b) and 2(c), respectively. In FIG. 2(b), the subregions 21a–21d in the group 21 are exposed in the order 21a, 21c, 21d, 21b, which is the same as the order in which the subregions 22a–22d in the group 22 are exposed. However, the order for exposing subregions in each group need not be identical from one group to the next. For example, in FIG. 2(c), the subregions 21a–21d in the group 21 are exposed in the order 21a, 21c, 21d, 21b, but the subregions 22a–22d in the group 22 are exposed in the order 22c, 22a, 22b, 22d. Also, in FIG. 2(c), the direction of the deflection imparted to the illumination beam to move from one group to the next alternates from one group to the next. Nevertheless, in any event, the subregions and groups of subregions are exposed according to a pre-determined order.

Figure 3A:
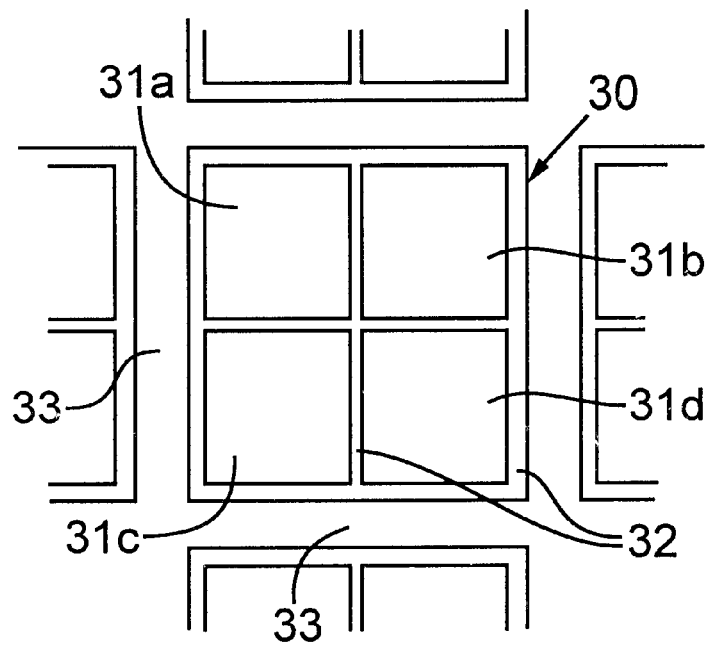
FIGS. 3(*a*)–3(*b*) are planar views of respective exemplary subfields divided into multiple subregions according to the invention.
Figure 3B:
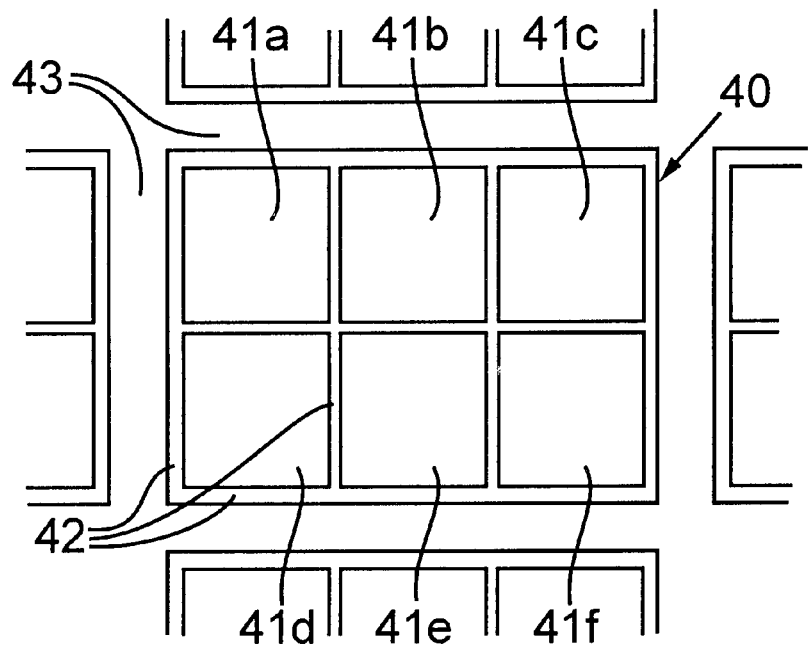

For convenience, each group was described above as having four respective subregions, as shown in FIG. 3(a). Specifically, FIG. 3(a) shows a group 30 consisting of four subregions 31a–31d separated from each other by skirts 32. The groups 30 are separated from each other by strut regions 33. However, it will be understood that the number of subregions in a group is not limited to four. In general, each group includes at least two subregions. By way of example, as shown in FIG. 3(b), a group 40 alternatively can include six respective subregions 41a–41f separated from each other by skirts 42. The groups are separated from each other by strut regions 43. With a group as shown in FIG. 3(b), the order in which subregions within the group and from one group to the next are exposed can be structured in a manner similar to that described above in the context of four subregions per group.

As will be understood from the foregoing discussion, the subfields of the reticle are divided into respective groups of multiple subregions each defining a respective portion of the reticle pattern. The term "multiple" in this context means at least two subregions per subfield. The illumination beam is directed, according to a predetermined exposure sequence, to each of the groups. At each group, the illumination beam exposes the constituent subregions in a predetermined order before the illumination beam is directed to a subsequent group. The subregions in each group can be exposed in a predetermined order that, for example, is identical from one group to the next in the sequence. According to another example, the predetermined order is identical for every other group in the sequence. Other exposure orders also are possible. The operation of deflecting the illumination beam from one group to the next desirably is performed using a first deflector. The operation of deflecting the illumination beam from one subregion to the next in a given group desirably is performed using a second deflector. (These deflectors desirably constitute respective portions of the illumination-optical system.) As the second deflector is directing, according to the predetermined order, the illumination beam from one subregion to the next in a group, the first deflector continuously keeps the illumination beam directed to the subject group. After all the subregions in the subject group are exposed according to the predetermined order, the first deflector directs the illumination beam to the next group. This configuration and operation of deflectors, as well as the exposure sequences of groups and subregions within groups, surprisingly yields a net decrease in the amount of exposure time required to expose the entire pattern, with a concomitant increase in throughput.

EXAMPLE AND COMPARISON EXAMPLE

In this example, exposure accuracy and exposure time for an exposure scheme according to the invention are compared to exposure accuracy and exposure time for a conventional exposure scheme. During each exposure, the beam semi-angle is 6 mrad, the axial distance from the reticle to the substrate is 600 mm, the beam-acceleration voltage is 100 keV, and the beam current at the substrate is 5 µA.

In the example, each subfield of the pattern was divided into four respective subregions that were exposed individually in a sequential manner. Each subregion was square in profile, with sides having a length of 125 µm (on the substrate). In the comparison example, the individually exposed subfields were square, with sides having a length of 250 µm on the substrate. The distribution of pattern elements was uniform in both the example and comparison example. The maximum lateral deflection ("deflection width") on the substrate was ±2.5 mm. Results are listed in Table 1, below.

TABLE 1

|  | Blur | ΔBlur | Distortion |
| --- | --- | --- | --- |
| Example: | 66 nm | ±3.0 nm | 3.2 nm |
| Comp. Example | 61 nm | ±5.0 nm | 7.1 nm |

The distortion d within an exposed subregion (Example) or subfield (Comparison Example) is represented by the expression:

$$d=(d_s^2+d_d^2)^{1/2} \quad (1)$$

wherein $d_s$ is distortion caused by the space-charge effect and $d_d$ is distortion caused by deflection. The distortion $d_s$ varies principally with the area of the subregion or subfield and the beam current, and the distortion $d_d$ varies principally with the area of the subregion or subfield and the magnitude of lateral beam deflection. In the comparison example $d_s$ and dd were both 5.0 nm, but in the example were 3.0 nm and 1.2 nm, respectively.

Therefore, in the example, Δblur within individual subregions is reduced by ±2 nm, and distortion within individual subregions caused by the space-charge effect is reduced by 2 nm, relative to the comparison example. The significance of reduced Δblur within a subregion is that variation in the linewidth of the exposed pattern is reduced correspondingly, with the lines as exposed being more uniform in width. As a result, the performance of the fabricated device is improved correspondingly as well as stabilized.

For example, assume the allowable distortion within a subregion is 5 nm for both $d_s$ and $d_d$. By decreasing the subregion size to 125 µm, the distortion $d_s$ caused by the space-charge effect is reduced correspondingly, making it possible for the beam current on the substrate to reach a maximal value of 8 µA on the substrate. In addition, by reducing the size of the subregion in the example, compared to the comparison example, distortion $d_d$ within the subregion due to deflection geometric aberrations from beam deflection is reduced to about 1.2 nm. Consequently, distortion d within a subregion is about 5.1 nm even when the beam current is 8 µA, and exposure accuracy correspondingly is improved.

To compare exposure time, reference is made to FIG. 2(a), in which the subfield is subdivided into four subregions. I.e., the conventional subfield is divided into four subregions 11a–11d. Hence, this example differs from a conventional divided-reticle exposure scheme in that this example requires four exposures and three deflections, as indicated by the arrows A–C, for each exposure made by the conventional scheme. The deflection indicated by the arrow D represents deflection to an adjacent subfield (group of subregions), similar to the conventional scheme. Hence, this deflection does not require special consideration in this analysis.

In this example, with an electron beam current of 8 $\mu$A and a demagnification ratio of 1/4, the current density (compared to the comparison example) is increased 4(8/5)=6.4-fold. If parameters such as the nature of the resist are identical in the example as in the comparison example, then the exposure time required for each subregion or subfield is a function mainly of the current density. Hence, in the example, the exposure time for one subregion is $\frac{1}{6.4}^{th}$ the exposure time for one subfield in the comparison example.

The number of beam displacements (deflections) in the example is three-fold greater than in the comparison example (arrows A–D in the example versus arrow D in the comparison example). However, if the transition time T needed for each beam deflection is within:

$$(T_{CE})(1-4/6.4)/3 \quad (2)$$

(wherein $T_{CE}$ is the exposure time for the comparative example), throughput can be maintained at least as high as achieved with the comparison example.

Beam transition time is a function of deflector performance. Various schemes have been considered for reducing transition time. But, simply decreasing the magnitude of lateral deflection correspondingly decreases the transition time. As described above, the deflection width required to make a transition from one conventional subfield to another (see FIG. 6) is ±250 $\mu$m on the substrate. In contrast, the deflection width for any of the arrows A–C in the example is a mere ±100 $\mu$m, which is much less than ±250 $\mu$m. Also, the maximum conventional deflection width is ±2.5 mm, whereas the maximum deflection width in the example (arrows A–C) is a mere ±100 $\mu$m. Hence, again, transition time in the example is reduced substantially.

The possible transition time using deflectors according to the example is calculated as follows: Assuming a ratio of an area of the patterning aperture to an area of the subfield is 0.25 in each case, a resist sensitivity of 5 $\mu$C/cm$^2$, a beam current at the reticle of 32 $\mu$A (8 $\mu$A at the substrate), and a subregion size (on the substrate) of 0.125-mm square, current density at the substrate is:

$$(32 \, \mu A)/[(0.125 \, mm)(0.125 \, mm)]=204.8 \, mA/cm^2 \quad (3)$$

The exposure time for one subregion is:

$$(5 \, \mu C/cm^2)/(204.8 \, mA/cm^2)=24.41 \, \mu sec \quad (4)$$

In contrast, the conventional beam current is 20 $\mu$A (5 $\mu$A at the substrate), so beam-current density is:

$$(20 \, \mu A)/[(0.25 \, mm)(0.25 \, mm)]=32 \, mA/cm^2 \quad (5)$$

The exposure time for one subregion is:

$$(5 \, \mu C/cm^2)/(32 \, mA/cm^2)=156.25 \, \mu sec \quad (6)$$

Therefore, the result of Equation (2) for maximum transition time for beam deflection is within:

$$(156.25 \, \mu sec)(1-4/6.4)/3=19.53 \, \mu sec \quad (7)$$

In an exposure scheme according to the invention, correction of image focus, rotation, magnification, etc., of the images of subregions within each group can be performed in common within a group. However, correction values within a group also can be modified from subregion to subregion, thereby providing even greater exposure accuracy. Although, in the description above, the transition time between subregions is a function of deflector performance, if the settling time of the correctors used to correct focus, rotation, and magnification is long, then the transition time is a function of corrector performance.

Also, the present invention provides increased accuracy of microlithographic exposure without reducing throughput. Put another way, the present invention provides increased throughput with no decrease in exposure accuracy. In this regard, it is possible to determine the size of subregions and the number of subregions in each group in accordance with the desired or required exposure accuracy, taking into account the transition time between subregions, as determined by beam-current density, deflector performance, etc.

Transition time within each group can be kept to within about 1 $\mu$sec by using electrostatic deflector(s). An electrostatic deflector employs electrostatic force to repel or attract the beam as required to select a subregion within a group.

Positional deviations due to tiny deflection-distortion changes arising when deflecting the beam within a group can be cancelled by using a deflector situated between the reticle and the substrate. The deflector is operated in synchrony with the deflector used for selecting individual subregions on the reticle for exposure. For example, one of the three deflectors 7 in FIG. 1 can be used for this purpose (e.g., the deflector nearest the substrate).

Figure 4:
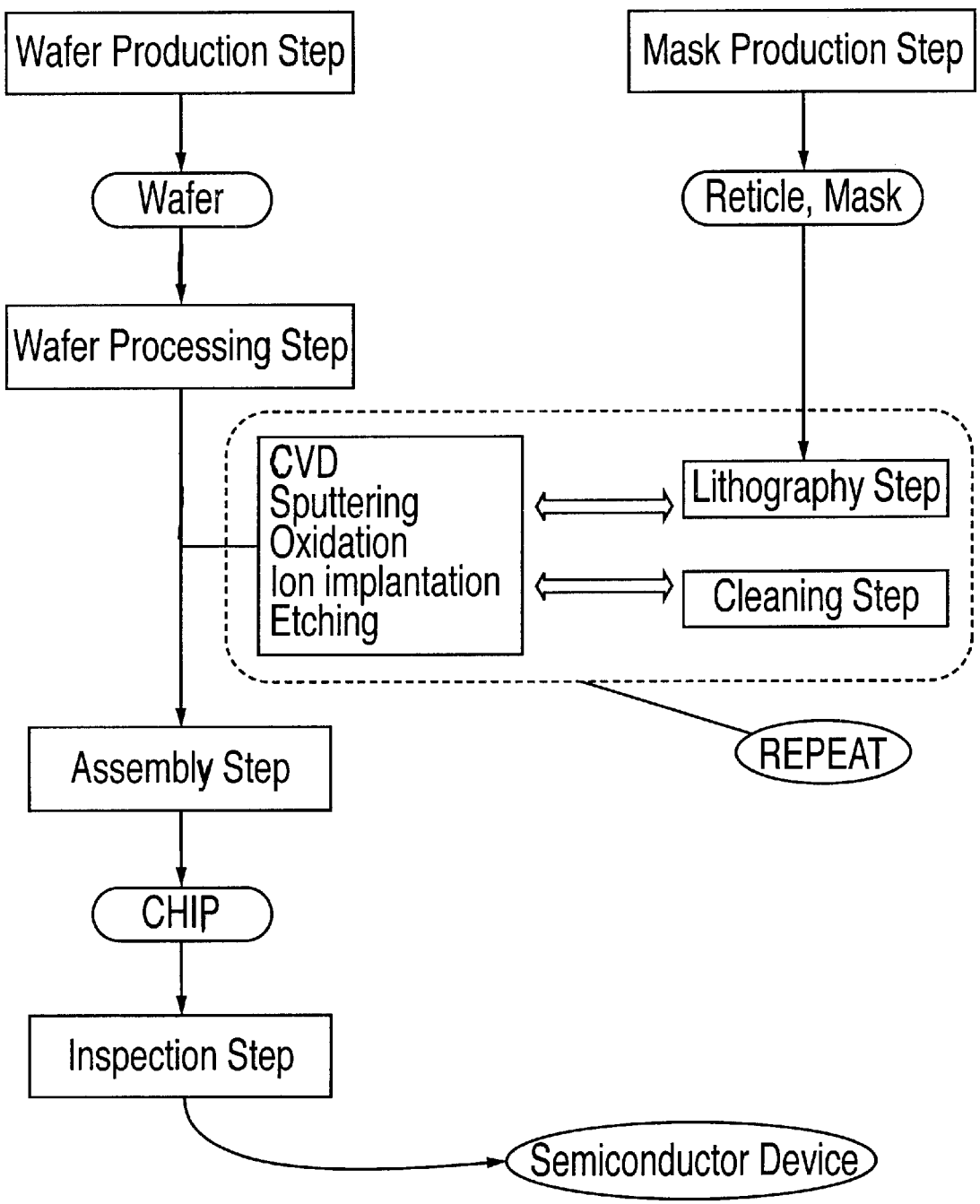
FIG. 4 is a process flowchart for manufacturing a semiconductor device, wherein the process includes a microlithography method according to the invention.

FIG. 4 is a flowchart of an exemplary microelectronic-fabrication method to which apparatus and methods according to the invention can be applied readily. The fabrication method generally comprises the main steps of wafer production (wafer preparation), reticle production (reticle preparation), wafer processing, device assembly, and inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, wherein the formation of each layer typically involves multiple sub-steps. Usually, many operative microelectronic devices are produced on each wafer.

Typical wafer-processing steps include: (1) thin-film formation involving formation of a dielectric layer for electrical insulation or a metal layer for connecting wires; (2) microlithography to form a resist pattern for selective processing of the thin film or the substrate itself; (3) etching or analogous step to etch the thin film or substrate according to the resist pattern, or doping as required to implant ions or impurities into the thin film or wafer; (4) resist stripping to remove the resist from the wafer; and (5) chip inspection. Wafer processing is repeated as required (typically many times) to fabricate the desired microelectronic devices on the wafer.

Figure 5:
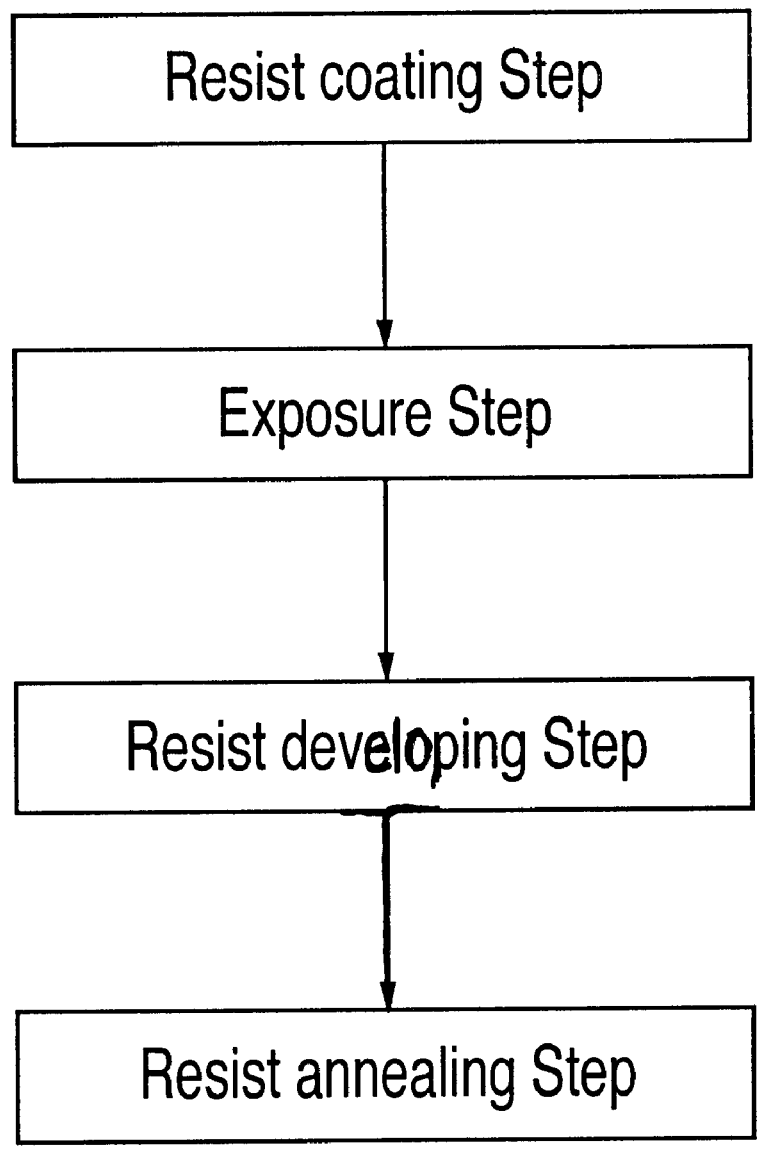
FIG. 5 is a process flowchart for performing a microlithography method that includes a microlithography method according to the invention.

FIG. 5 provides a flowchart of typical steps performed in microlithography, which is a principal step in wafer processing. The microlithography step typically includes: (1) resist-coating step, wherein a suitable resist is coated on the wafer surface (which can include a circuit element formed in a previous wafer-processing step); (2) exposure step, to expose the resist with the desired pattern; (3) development step, to develop the exposed resist; and (4) optional annealing step, to enhance the durability and/or stability of the resist pattern.

Methods and apparatus according to the invention can be applied to a semiconductor fabrication process, as summarized above, to provide substantially improved throughput without sacrificing accuracy or resolution.

Whereas the invention has been described in connection with a representative embodiment, it will be understood that the invention is not limited to that embodiment. On the contrary, the invention is intended to encompass all alternatives, modifications, and equivalents as may be included within the spirit and scope of the invention, as defined by the appended claims.

What is claimed is:

1. In a method for performing charged-particle-beam (CPB) microlithography in which a region on a pattern-defining reticle, divided into multiple subfields, is illuminated with an illumination beam to produce an image of the illuminated region as projected on a sensitive substrate, a method for exposing the subfields, comprising:

(a) dividing each of the subfields into respective groups of multiple subregions such that each subfield comprises at least two respective subregions;

(b) directing an illumination beam in sequence to each of the groups; and (c) at each group, directing the illumination beam to expose the respective subregions in the group in a predetermined order before directing the illumination beam to a subsequent group.

2. The method of claim 1, wherein the subregions in each group are exposed in the predetermined order that is identical from one group to the next in the sequence.

3. The method of claim 1, wherein the subregions in each group are exposed in the predetermined order that is identical for every other group in the sequence.

4. The method of claim 1, wherein step (b) is performed using a first deflector, and step (c) is performed using a second deflector.

5. The method of claim 4, wherein the first and second deflectors are provided in an illumination-optical system.

6. A method for manufacturing a microelectronic device, comprising the steps of:

(a) preparing a wafer;

(b) processing the wafer; and (c) assembling devices formed on the wafer during steps (a) and (b), wherein step (b) comprises a method for performing microlithography as recited in claim 1.

7. A microelectronic device produced by the method of claim 6.

* * * * *

UNITED STATES PATENT AND TRADEMARK OFFICE
CERTIFICATE OF CORRECTION

PATENT NO. : 6,573,014 B2  Page 1 of 1
DATED : June 3, 2003
INVENTOR(S) : Yamaguchi et al.

It is certified that error appears in the above-identified patent and that said Letters Patent is hereby corrected as shown below:

Column 1,
Line 27, "micro lithography." should be -- microlithography. --.

Column 8,
Line 35, "dd" should be -- $d_d$ --.

Signed and Sealed this

Fourth Day of November, 2003

JAMES E. ROGAN
*Director of the United States Patent and Trademark Office*